United States Patent
Ciccone et al.

(10) Patent No.: US 8,300,374 B2
(45) Date of Patent: Oct. 30, 2012

(54) METHOD FOR LIMITING CURRENT AND CIRCUIT THEREFOR

(75) Inventors: Thomas William Ciccone, Tempe, AZ (US); Thomas Duffy, Maricopa, AZ (US); Bryan McCoy, Chandler, AZ (US); Timothy Kaske, Phoenix, AZ (US); John Ciccone, Scottsdale, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 485 days.

(21) Appl. No.: 12/269,402

(22) Filed: Nov. 12, 2008

(65) Prior Publication Data

US 2010/0118462 A1 May 13, 2010

(51) Int. Cl.
*H02H 3/08* (2006.01)
*H02H 9/02* (2006.01)
*H02H 9/08* (2006.01)

(52) U.S. Cl. ...................... 361/93.1; 361/93.9

(58) Field of Classification Search .................. 361/93.9
See application file for complete search history.

(56) References Cited

U.S. PATENT DOCUMENTS 7,259,603 B2 * 8/2007 Gibson et al. ................ 327/170
7,701,188 B2 * 4/2010 Kojima ......................... 323/284

* cited by examiner

*Primary Examiner* — Dharti Patel
(74) *Attorney, Agent, or Firm* — Rennie William Dover

(57) ABSTRACT

A semiconductor component that includes a current limit circuit and a method for limiting current in the semiconductor component. An input/output pin is connected to the gate of a transistor and a control resistor is connected between the gate of the transistor and its source. One terminal of the control resistor is connected to the input/output pin and the other terminal is connected to another input/output pin. A current source is connected to the input/output pin. A reference voltage is generated between the two input/output pins and compared with a drain-source voltage that is between one of the two input/output pins and another input/output pin. A control voltage is set in accordance with the comparison. The control voltage then controls the voltage on another of the pins that is not common to the reference voltage and to the drain-source voltage.

20 Claims, 1 Drawing Sheet

US 8,300,374 B2

METHOD FOR LIMITING CURRENT AND CIRCUIT THEREFOR

TECHNICAL FIELD

The present invention relates, in general, to semiconductor components and, more particularly, to limiting current in semiconductor components.

BACKGROUND

Semiconductor components are used in portable applications such as mobile telephones, portable computers, calculators, cameras, Personal Digital Assistants (PDAs), video game controllers, etc. and in non-portable applications such as mainframe computers, test equipment, automotive applications, manufacturing facilities, etc. In these applications it is desirable for the semiconductor components to have small form factors while optimizing their performance, functionality, and cost. An important class of semiconductor components used in these applications is current limit circuits. These circuits protect the semiconductor component during overcurrent conditions. A drawback with including current limit circuits in semiconductor components is that they use one of the semiconductor component's input/output pins which increases the size and cost of the semiconductor components while reducing their performance and functionality.

Accordingly, it would be advantageous to have a semiconductor component that includes methods and structures for limiting current in the semiconductor component without increasing the number of input/output pins. It would be of further advantage for the semiconductor component to be cost efficient to manufacture.

BRIEF DESCRIPTION OF THE DRAWINGS

The present invention will be better understood from a reading of the following detailed description, taken in conjunction with the accompanying drawing figures, in which like reference numbers designate like elements and in which.

DETAILED DESCRIPTION

Generally, the present invention provides a semiconductor component that includes a method and structure for limiting current. In accordance with an embodiment of the present invention, an integrated circuit includes a current limit circuit comprising an integrated comparator and control portion having an input/output pin coupled to the source of a high side N-channel field effect transistor through a control resistor and to the gate of the high side N-channel field effect transistor. Another output of the integrated comparator and control portion is connected to the source of a low side N-channel field effect transistor through another control resistor and to the gate of the low side N-channel field effect transistor. The high and low side N-channel field effect transistors and the control resistors may be integrated with the integrated comparator and control portion or they may be separate circuit elements that are coupled to the integrated comparator and control portion. Although the field effect transistors have been shown and described as N-channel field effect transistors, this is not a limitation of the present invention. For example, the transistors may be P-channel field effect transistors, NPN bipolar junction transistors, PNP bipolar junction transistors, or the like. It should be noted that the gate of a field effect transistor is referred to as a control electrode whereas the source and drain of a field effect transistor are referred to as current carrying or current conducting electrodes. Similarly, the base of a bipolar junction transistor is referred to as a control electrode whereas the collector and emitter are referred to as current carrying or current conducting electrodes.

In accordance with another embodiment of the present invention, a method for limiting current is provided that does not increase the number of input/output pins, i.e., that does not increase the input/output pin count of a semiconductor component. A drain-source voltage that is between two input/output pins is compared to a reference voltage that is between two input/output pins, where the reference voltage and the drain-source voltage share an input/output pin. A control voltage is set in accordance with the results of the comparison, where the control voltage controls the voltage on one of the input/output pins that is not common to the reference voltage and the drain-source voltage.

Figure 1:
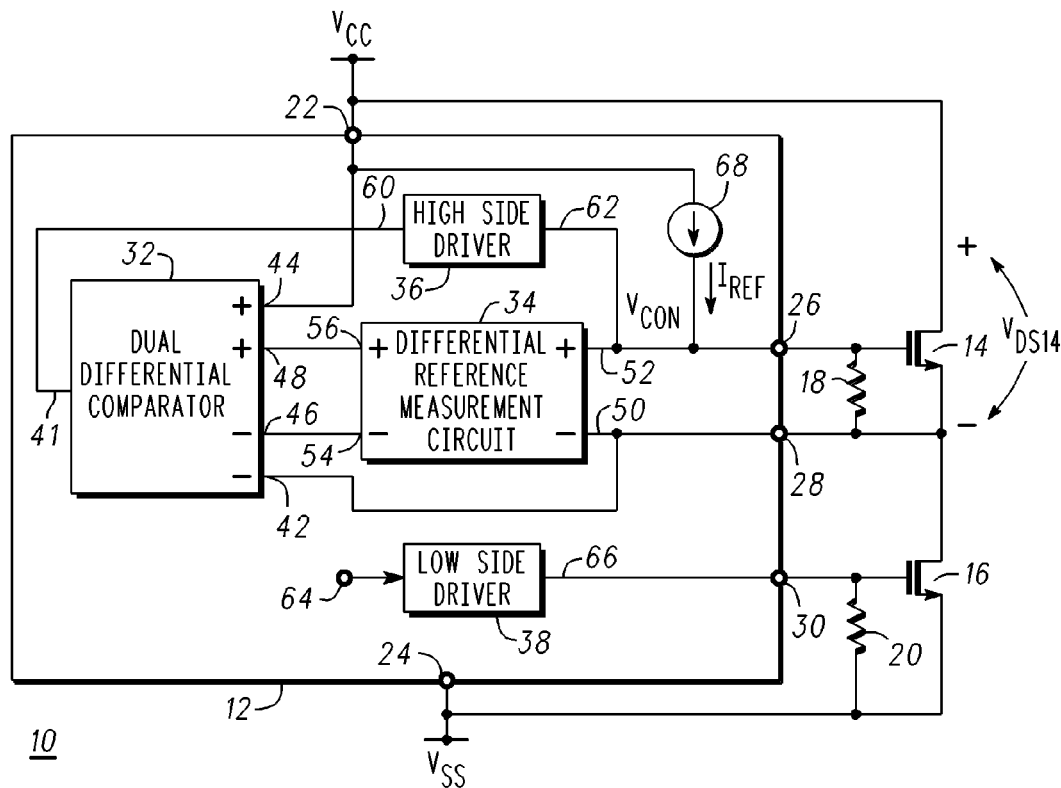
FIG. 1 is a circuit schematic of a current limit circuit in accordance with an embodiment of the present invention.

FIG. 1 is a circuit schematic of a high side current limit circuit 10 in accordance with an embodiment of the present invention. Preferably, current limit circuit 10 comprises an integrated comparator and control portion 12 coupled to driver transistors 14 and 16 and to control resistors 18 and 20. Integrated comparator and control portion 12 has at least input/output pins 22, 24, 26, 28, and 30 and comprises a dual differential comparator 32, a differential reference measurement circuit 34, a high side driver circuit 36, and a low side driver circuit 38. It should be noted that input/output pins 22, 24, 26, 28, and 30 are described as being pins because they may be the pins of a packaged semiconductor device. However, this is not a limitation of the present invention. They can also be input/output nodes in embodiments in which, for example, current limit circuit 10 is monolithically integrated or partially monolithically integrated. It should be further noted that input/output pins 22, 24, 26, 28, and 30 have been referred to as input/output pins for the sake of clarity. Alternatively, one or more of input/output pins 22, 24, 26, 28, and 30 may be input pins (or input nodes) or output pins (or output nodes). Preferably, dual differential comparator 32 is a dual differential common mode reducing, level shifting, low pass filtering averaging current limit comparator. Dual differential comparator 32 has an output 41 and two sets of differential inputs. One set of differential inputs is comprised of an inverting input 42 and a non-inverting input 44 and the other set of differential inputs is comprised of an inverting input 46 and a non-inverting input 48. Differential reference measurement circuit 34 has a set of differential inputs and a set of differential outputs where the set of differential inputs is comprised of an inverting input 50 and a non-inverting input 52 and the set of differential outputs is comprised of an inverting output 54 and a non-inverting output 56. High side driver circuit 36 has an input 60 and an output 62 and low side driver circuit 38 has an input 64 and an output 66. For the sake of clarity, low side driver circuit 38 has been shown in block form having input 64. Topologies for low side driver circuit 38 and circuits that are coupled to input 64 for driving low side driver circuit 38 are known to those skilled in the art.

Output 62 of high side driver circuit 36 is connected to non-inverting input 52 of differential reference measurement circuit 34 and to input/output pin 26. Output 66 of low side driver circuit 38 is connected to input/output pin 30. Inverting output 54 and non-inverting output 56 of differential reference measurement circuit 34 are connected to inverting input 46 and non-inverting input 48 of dual differential comparator 32, respectively. Non-inverting input 44 of dual differential comparator 32 is connected to input/output pin 22, inverting input 42 of dual differential comparator 32 is connected to inverting input 50 of differential reference measurement circuit 34 and to input/output pin 28. Output 41 of dual differential comparator 32 is connected to input 60 of high side driver circuit 36. Input/output pin 22 is coupled to input/output pin 26 by a current source 68 and it is coupled for receiving a source of operating potential $V_{CC}$. Although driver transistors 14 and 16 and control resistors 18 and 20 are shown as being discrete circuit elements, this is not a limitation of the present invention. Alternatively, driver transistors 14 and 16 and control resistors 18 and 20 may be monolithically integrated with comparator and control portion 12.

Transistor 14 has a gate connected to input/output pin 26, a drain coupled to input/output pin 22 and for receiving source of operating potential $V_{CC}$, and a source connected to input/output pin 28. Transistor 16 has a gate connected to input/output pin 30, a drain connected to the source of transistor 14 and to input/output pin 28, and a source coupled for receiving a source of operating voltage $V_{SS}$. Control resistor 18 is coupled between input/output pin 26 and input/output pin 28 and control resistor 20 is coupled between input/output pin 30 and input/output pin 24.

Figure 2:
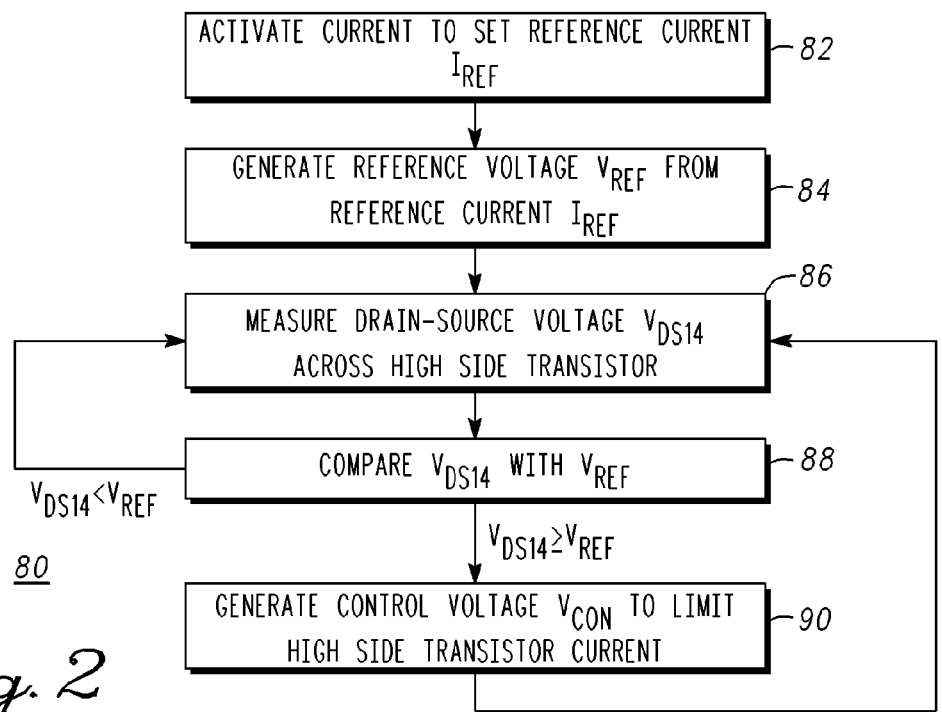
FIG. 2 is a flow diagram for limiting current in accordance with an embodiment of the present invention.

FIG. 2 is a flow diagram 80 of the operation of current limit circuit 10 in accordance with an embodiment of the present invention. A current limit trip point is set by activating current source 68 to transmit a current $I_{REF}$ through control resistor 28 (indicated by box 82) to generate a reference voltage $V_{REF}$ (indicated by box 84) across control resistor 18. Reference voltage $V_{REF}$ is transmitted through input/output pins 26 and 28 to the differential inputs 50 and 52 of differential reference measurement circuit 34. Thus, reference voltage $V_{REF}$ appears across non-inverting input 52 and inverting input 50 and is digitally stored by differential reference and measurement circuit 34. By way of example, current $I_{REF}$ is 12.5 microamps (µA) and control resistor 18 is selected to generate the desired reference voltage $V_{REF}$. It should be noted that the values of current $I_{REF}$ and control resistor 18 are design choices. Preferably current source 68 is turned off or inactivated after voltage $V_{REF}$ has been measured by differential reference measurement circuit 34. During normal operation, reference voltage $V_{REF}$ is transmitted from differential reference measurement circuit 34 to one of the sets of differential inputs of dual differential comparator 32, e.g., to inputs 48 and 46. The drain-source voltage, $V_{DS14}$, across driver transistor 14 is measured (indicated by box 86) and differentially compared to reference voltage $V_{REF}$ by dual differential comparator 32 (indicated by box 88). It should be noted that the comparison is not limited to being a differential comparison but can be a single-ended comparison. If drain-source voltage $V_{DS14}$ across driver transistor 14 is greater than or equal to voltage $V_{REF}$, dual differential comparator 32 generates a comparison voltage that is used by driver circuit 36 to generate a control voltage $V_{CON}$ at input/output pin 26 that turns off transistor 14 thereby limiting or lowering the current flowing through transistor 14 (indicated by box 90) and the circuit continues from or feeds back to the step indicated by box 86. Thus, control voltage $V_{CON}$ can be selected to turn off transistor 14 or to lower the current flowing through transistor 14. If drain-source voltage $V_{DS14}$ across driver transistor 14 is less than reference voltage $V_{REF}$, the circuit continues from or feeds back to the step indicated by box 86.

By now it should be appreciated that a structure and method have been provided for limiting current in a semiconductor component. The circuit may be implemented in a fully monolithically integrated configuration or a configuration in which a portion of the circuit is monolithically integrated and a portion is implemented from discrete circuit components. An advantage of the method and the structure is that current limiting is accomplished without increasing the input/output pin count, thereby reducing the size of the circuit, increasing the functionality of the circuit, and decreasing the cost of manufacturing the circuit. The functionality of the functionality of the circuit is increased because an input/output pin that is already present in the circuit and used for other tasks is also used for current limiting rather than using one of the input/output pins solely for current limiting. Thus, a method for limiting current in a circuit has been provided without changing the number of input/output pins.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for limiting current in a circuit having at least first, second, and third nodes, comprising:
   generating a reference voltage across the first node and the third node;
   comparing a voltage that is across the second node and the third node with the reference voltage to generate a comparison voltage; and
   generating a control voltage at the first node in accordance with the comparison voltage.

2. The method of claim 1, further including differentially comparing the reference voltage with a voltage across the second node and the third node.

3. The method of claim 1, further including using the control voltage to limit the current.

4. The method of claim 3, further including coupling a control electrode of a first transistor to the first node and coupling a control electrode of a second transistor to the third node, wherein using the control voltage to limit the current comprises applying the control voltage to the first node.

5. The method of claim 1, wherein generating the reference voltage includes generating the reference voltage across a resistor coupled between the first node and the third node.

6. The method of claim 5, wherein generating the reference voltage includes transmitting a current through the resistor.

7. The method of claim 6, further including turning off the current after generating the reference voltage.

8. A method for limiting current in a circuit without changing the number of input/output pins, comprising:
   generating a first voltage across a first input pin and a second input pin;
   comparing a second voltage with the first voltage, the second voltage across the first input pin and a third input pin; and
   setting a third voltage at the first input pin in response to the comparison between the first voltage and the second voltage.

9. The method of claim 8, wherein generating the second voltage across the first and second input pins comprises transmitting a current through the first input pin.

10. The method of claim 9, further including coupling a first resistor between the first input pin and the second input pin and wherein transmitting the current through the first input pin includes transmitting the current through the first resistor.

11. The method of claim 8, wherein comparing the second voltage with the first voltage includes differentially comparing the second voltage with the first voltage.

12. The method of claim 8, further including:
coupling a first resistor between the first and second input pins; and
coupling a first transistor to the first input pin.

13. The method of claim 12, wherein setting the third voltage turns off the first transistor.

14. The method of claim 12, wherein setting the third voltage limits a current through the first transistor.

15. The method of claim 12, further including coupling a second resistor to the fourth input pin and coupling a second transistor to the fourth input pin.

16. A current limit circuit having a plurality of pins, comprising:
a measurement circuit having an input and an output;
a comparator having first and second inputs and at least one output, wherein the output of the measurement circuit is coupled to the first input of the comparator;
a first driver having an input coupled to the at least one output of the comparator and an output connected to a first pin of the plurality of pins;
a current source coupled between a second pin and the first pin of the plurality of pins; and
a first resistor coupled between the first pin and a third pin of the plurality of pins.

17. The current limit circuit of claim 16, wherein the measurement circuit has a differential input and wherein the first input is a differential input comprises an inverting input and a non-inverting input and the output is a differential output comprising an inverting output and a non-inverting output, the non-inverting input coupled to the first pin of the plurality of pins and the inverting input coupled to the third pin of the plurality of pins.

18. The current limit circuit of claim 17, wherein the comparator is a dual differential comparator, and wherein the first input is a first differential input comprising a first inverting input and a first non-inverting input, the second input is a second differential input comprising a second inverting input and a second non-inverting input, the first non-inverting input coupled to the second pin of the plurality of pins, the first inverting input coupled to the third pin of the plurality of pins, the second non-inverting input coupled to the non-inverting output of the measurement circuit, and the second inverting input coupled to the inverting output of the measurement circuit.

19. The current limit circuit of claim 17, further including a first transistor having a control electrode and first and second current carrying electrodes, the control electrode coupled to the first pin of the plurality of pins and the first current carrying electrode coupled to the third pin of the plurality of pins.

20. The current limit circuit of claim 19, further including:
a second driver circuit having an output coupled to a fourth pin of the plurality of pins;
a second transistor having a control electrode and first and second current carrying electrodes, the control electrode coupled to the fourth pin of the plurality of pins and the first current carrying electrode coupled to the third pin of the plurality of pins; and
a second resistor coupled to the fourth pin of the plurality of pins.

* * * * *